(12) United States Patent
Paul et al.

(10) Patent No.: US 11,506,734 B2
(45) Date of Patent: Nov. 22, 2022

(54) ARRANGEMENT OF ADJACENT LAYER STRUCTURES FOR A MAGNETORESISTIVE MAGNETIC FIELD SENSOR, MAGNETORESISTIVE MAGNETIC FIELD SENSOR AND METHOD FOR PRODUCING

(71) Applicant: Sensitec GmbH, Wetzlar (DE)

(72) Inventors: Johannes Paul, Mainz (DE); Jürgen Wahrhusen, Nieder-Hilbersheim (DE)

(73) Assignee: SENSITEC GMBH, Welzlar (DE)

(*) Notice: Subject to any disclaimer, the term of this patent is extended or adjusted under 35 U.S.C. 154(b) by 0 days.

(21) Appl. No.: 17/426,948

(22) PCT Filed: Jan. 31, 2020

(86) PCT No.: PCT/EP2020/052461
§ 371 (c)(1),
(2) Date: Jul. 29, 2021

(87) PCT Pub. No.: WO2020/157293
PCT Pub. Date: Aug. 6, 2020

(65) Prior Publication Data
US 2022/0091198 A1    Mar. 24, 2022

(30) Foreign Application Priority Data

Feb. 1, 2019 (DE) .................... 102019102618.0
Mar. 26, 2019 (DE) .................... 102019107689.7

(51) Int. Cl.
*G01R 33/09* (2006.01)

(52) U.S. Cl.
CPC ......... *G01R 33/098* (2013.01); *G01R 33/093* (2013.01)

(58) Field of Classification Search
CPC . G01R 33/093; G01R 33/098; G01R 33/0011
See application file for complete search history.

(56) References Cited

U.S. PATENT DOCUMENTS

| 7,505,233 B2 | 3/2009 | Grimm et al. |
| 7,605,437 B2 | 10/2009 | Mancoff et al. |

(Continued)

FOREIGN PATENT DOCUMENTS

| DE | 112010003775 T5 | 10/2012 |
| EP | 3091364 A1 | 11/2016 |

(Continued)

OTHER PUBLICATIONS

International Search Report dated May 15, 2020; International Application No. PCT/EP2020/052461.

(Continued)

*Primary Examiner* — Alvaro E Fortich
(74) *Attorney, Agent, or Firm* — Dinsmore & Shohl LLP

(57) ABSTRACT

An arrangement of at least two adjacently arranged layer structures is provided for a magnetoresistive magnetic field sensor. Each layer structure has at least one antiferromagnetic layer, and a first ferromagnetic layer with a first magnetic moment. Exchange coupling is present between the antiferromagnetic layer and the first ferromagnetic layer. A second ferromagnetic layer with a second magnetic moment is included, wherein the second ferromagnetic layer is antiparallel coupled to the first ferromagnetic layer via a non-magnetic coupling layer arranged between the first and second ferromagnetic layers. The magnetisation of the corresponding first and corresponding second ferromagnetic layers of the adjacently arranged layer structures differs from one another, and in particular is of substantially mutually opposed orientation. Also provided is a magnetoresistive magnetic field sensor with such an arrangement of layer structures and a method for producing the arrangement of layer structures and the magnetoresistive magnetic field sensor.

40 Claims, 7 Drawing Sheets

(56) References Cited

U.S. PATENT DOCUMENTS

| | | | |
|---|---|---|---|
| 2002/0191348 A1* | 12/2002 | Hasegawa | B82Y 25/00 |
| 2008/0232003 A1 | 9/2008 | Ibusuki et al. | |
| 2009/0015252 A1* | 1/2009 | Raberg | H01L 27/22 |
| | | | 324/252 |
| 2009/0190262 A1* | 7/2009 | Murakami | G11C 11/161 |
| | | | 360/324.11 |
| 2009/0190264 A1* | 7/2009 | Fukuzawa | H01L 27/228 |
| | | | 257/E29.323 |
| 2010/0276389 A1* | 11/2010 | Mather | B82Y 25/00 |
| | | | 216/22 |
| 2012/0147504 A1* | 6/2012 | Zhou | G01R 33/098 |
| 2013/0265039 A1 | 10/2013 | Cai et al. | |
| 2014/0021571 A1* | 1/2014 | Lei | H01L 43/02 |
| | | | 257/427 |
| 2015/0213815 A1 | 7/2015 | Sapozhnikov et al. | |
| 2015/0318465 A1 | 11/2015 | Aggarwal et al. | |
| 2016/0313411 A1* | 10/2016 | Koike | G01R 33/098 |
| 2017/0328963 A1 | 11/2017 | Schmitt et al. | |
| 2018/0238972 A1 | 8/2018 | Ohta et al. | |

FOREIGN PATENT DOCUMENTS

| | | |
|---|---|---|
| EP | 3285041 A1 | 2/2018 |
| WO | 2016078793 A1 | 5/2016 |
| WO | 2016083420 A1 | 6/2016 |

OTHER PUBLICATIONS

Freitas, Paulo P.; Spintronic Sensors; vol. 104, No. 10, Oct. 2016; pp. 1894-1918.

* cited by examiner

US 11,506,734 B2

ARRANGEMENT OF ADJACENT LAYER STRUCTURES FOR A MAGNETORESISTIVE MAGNETIC FIELD SENSOR, MAGNETORESISTIVE MAGNETIC FIELD SENSOR AND METHOD FOR PRODUCING

CROSS-REFERENCE TO RELATED APPLICATIONS

This application is a U.S. National Stage of PCT/EP2020/052461 filed Jan. 31, 2020, which claims priority to German Application No. 102019102618.0 filed Feb. 1, 2019, and German Application No. 102019107689.7 filed Mar. 26, 2019, the entire content of both are incorporated herein by reference in their entirety.

FIELD OF THE INVENTION

The present invention relates to an arrangement of adjacent layer structures for a magnetoresistive magnetic field sensor, comprising at least one antiferromagnetic layer, a first ferromagnetic layer with a first magnetic moment, wherein exchange coupling is present between the antiferromagnetic layer and the first ferromagnetic layer, and a second ferromagnetic layer with a second magnetic moment, wherein the second ferromagnetic layer is antiparallel coupled with the first ferromagnetic layer via a non-magnetic coupling layer arranged between the first and second ferromagnetic layers.

The invention further relates to a magnetoresistive magnetic field sensor with such an arrangement of layer structures and to a method for producing the arrangement of layer structures and the magnetoresistive magnetic field sensor.

BACKGROUND OF THE INVENTION

Magnetoresistive magnetic field sensors serve in resistance-based measurement of magnetic fields. Through suitable geometric arrangements, further physical quantities such as for example path, angle or current intensity can be detected. Magnetoresistive magnetic field sensors are based on a magnetoresistive effect. This describes a change in the electrical resistance of a material as the result of applying or modifying an external magnetic field. Magnetic field sensors with a comparatively high magnetoresistive effect, which may be described by the quotient of change in resistance ($\Delta R = R_{Max} - R_{Min}$) and minimum resistance $R_{Min}$, are based on the giant magnetoresistance effect (GMR effect) or the tunnel magnetoresistance effect (TMR effect). Alternatively, materials are available which exhibit the AMR (anisotropic magnetoresistance) effect. These effects are also denoted collectively as the xMR effect.

GMR and TMR magnetic field sensors comprise a thin-film structure of non-magnetic and magnetic materials, in which magnetic coupling or a spin effect through the layers influences electrical resistance. In GMR- and TMR-based magnetoresistive layer structures, a change in the electrical resistance based on an external magnetic field of up to 50% (GMR) or up to 600% (TMR) can be achieved.

To produce TMR magnetic field sensors, a layer structure is formed of at least two ferromagnetic layers and an electrically insulating barrier layer, which serves as a tunnel barrier and is also denoted an interlayer, such that a tunnel current can flow between the two ferromagnetic layers. In the case of a TMR magnetic field sensor, the barrier layer consists for example of aluminium oxide ($Al_2O_3$) or Magnesium oxide (MgO). In the case of a GMR magnetic field sensor, a thin non-magnetic but conductive layer of Cu or Ru is often used. Apart from geometric parameters such as surface area, the electrical resistance of a tunnel element is dependent on how the two ferromagnetic layers are magnetised relative to one another. If the two ferromagnetic layers are magnetised parallel to one another, the resistance $R_{Min}$ is at a minimum. If, on the other hand, they are magnetised antiparallel to one another, the resistance $R_{Max}$ is at a maximum.

In practice, the direction of magnetisation of one of the two ferromagnetic layers is frequently fixed or pinned, such that the magnetisation of this layer does not react or reacts only weakly to external fields. This layer is denoted a reference layer or also a pinned layer. The other layer is configured such that the magnetisation thereof may follow the external field in a defined way. This layer is also known as a detection layer or free layer.

Through this division into a reference layer and a detection layer, which react differently to external fields, it is possible to achieve changes in resistance on modification of external fields and obtain a sensing device. The dependence on resistance correlates with the angle between the direction of magnetisation of the detection layer, which is also denoted a "free layer", and the direction of magnetisation of the reference layer, also denoted a "pinned layer".

A layer structure is in this case a structure which can be described in the one axis typically perpendicular to the substrate surface as a sequence of thin films, while in the other axes orthogonal thereto it has a geometric shape.

Thin-film technologies are used to produce such structures or resistance elements. In the context of the production method, the direction of magnetisation of the reference layer may be permanently established, which is frequently denoted pinning. To pin the ferromagnetic layer or the reference layer, the ferromagnetic layer is generally coupled to an antiferromagnetic neighbouring layer. To establish the direction of magnetisation, the resistance element, i.e. the layer structure, is heated to above the "blocking temperature", at which the exchange coupling between the antiferromagnetic layer and the ferromagnetic layer disappears, this temperature as a rule being lower than the Curie temperature of the ferromagnetic layers. Once the desired temperature above the blocking temperature and below the Curie temperature has been reached, the ferromagnetic layers are exposed to an external pinning field, whereby these layers are forced into a defined direction of magnetisation. To this end, it is necessary for the applied pinning field to be large enough to orient the ferromagnetic layer wholly parallel to the pinning field. This direction of magnetisation is maintained if, with the pinning field applied, the layer structure is cooled again and the temperature falls below the blocking temperature.

In this context, a pinning field is moreover described as a locally acting magnetic field which, in a desired pinning direction, penetrates a ferromagnetic layer of the layer structure at right angles to the layer sequence, i.e. tangentially to the substrate surface, and constitutes a local magnetic field component. This differs from the "pretreating magnetic field" as overall orientation magnetic field, from which the pinning field is derived by guiding the magnetic field, e.g. by ferromagnetic patterning elements as flux guide elements. The overall pretreating magnetic field is generally stronger and can be oriented in a different direction from the local pinning field.

A disadvantage of such a reference multilayer system with just one ferromagnetic reference layer, also denoted a "simple spin valve (SSV)", consists in only low thermal stability. There is in particular a risk of the pinning direction being rotated in application by the occurrence of high temperatures and magnetic fields. This effect brings about a drift in the behaviour of a sensor using these reference layers. This means that the lower the magnetic moment of the reference layer, the more weakly may the magnetic fields be injected and the layer rotated. It is therefore favourable in this case to keep the layer thicknesses of the reference layer small, so that any drifts are also minor. However, the magnetoresistive effect in such SSV structures is comparatively minor. One advantage consists, however, in the fact that only low magnetic field strengths are needed to align the reference layer.

In the case of an improved reference layer structure, a second ferromagnetic layer is provided in addition to a first ferromagnetic layer arranged on the antiferromagnetic layer. Between these two ferromagnetic layers, a coupling layer is provided which brings about antiparallel, RKKY coupling (Ruderman-Kittel-Kasuya-Yoshida interaction) between the two ferromagnetic layers. Such layer structures are also denoted "antiparallel coupled pinned layer spin valve (APP-SV)".

Since the magnetic moments of the two ferromagnetic layers are typically approximately of equal magnitude and the total magnetic moment of the ferromagnetic layers is cancelled out to approximately zero due to the antiparallel alignment, in operation external magnetic fields cause only a slight change in the direction of magnetisation of the reference layer system, which means that such a balanced APP-SV is stable even at relatively high temperatures. In comparison with an SSV, the magnetoresistive effect of an APP-SV is moreover greater.

A significant disadvantage consists, however, in the fact that, because of the mutually cancelling magnetic moments of the two ferromagnetic layers (total magnetic moment approximately zero), pinning of this layer structure is only possible if the magnetic flux density is so great as to overcome the RKKY coupling between the ferromagnetic layers. For this purpose, magnetic flux densities of greater than 1 T are necessary. This requires major effort for the pinning process. Magnetic field sensors in which a plurality of layer stacks or resistor elements are provided which are intended to have a different magnetic orientation cannot be produced at all or only with very considerable effort.

To establish pinning directions, it is known to heat selectively spatially limited regions of a substrate bearing layer structures using selective heating methods, in particular using lasers, and to apply an external magnetic field in a desired direction parallel to the substrate surface for pinning purposes. It is thereby possible to pin locally heated regions with layer structures in an identical direction. If different pinning directions are to be produced on a substrate, the method has to be repeated multiple times with different external magnetic field alignments, wherein it is not however possible to pin spatially closely adjacent layer structures in different directions. On the other hand, for the construction of conventional direction-selective magnetic field sensors, layer structures are needed which have different preferred directions and which are subject to the same process-engineering characteristics, thus pinning of layer structures in different directions in closely adjacent layer structures is desirable.

Furthermore, laser pinning for under one second is disadvantageous for antiferromagnetic materials, which during the pinning process can only recrystallise into the antiferromagnetic chemically ordered crystal structure ($L1_0$ phase) such as for example PtMn or NiMn. The recrystallisation process typically lasts multiple hours and cannot in practice be achieved with local heating by laser light.

WO 2016/078793 A1 discloses a method and a device for multidirectional pinning of magnetic field sensors, in which soft magnetic patterning elements, i.e. flux guidance elements, are arranged adjacent the layer structures which inject a pretreating magnetic field into the layer structures. The method presented here enables injection of the pretreating magnetic field at right angles to the substrate surface, whereby any desired pinning directions tangential to the substrate surface can be established in the manner of multidirectional pinning. Such multidirectional pinning makes it possible, for example, to produce high-precision angle sensors with harmonic filtering of the sensor signal, as described for example in WO 2016/083420 A1. However, in practice with this method only low pinning flux densities can be achieved in ranges far below 1 T, such that this method is not usable with multilayer stack structures with strong magnetic coupling.

US 2015/0213815 A1 discloses a magnetoresistive sensor which comprises a layer stack arranged between a top and a bottom shield. The layer stack consists of an antiferromagnetic layer, a first ferromagnetic pinned layer and a second ferromagnetic reference layer, wherein the two layers are coupled together antiparallel by a non-magnetic coupling layer. A quotient of a first magnetic moment of the first ferromagnetic layer and a second magnetic moment of the second ferromagnetic layer amounts to over 1.1. However, no arrangement of or production method for two adjacent, identically constructed TMR elements with differing preferred directions on a substrate in a magnetoresistive magnetic field sensor is known therefrom.

U.S. Pat. No. 7,505,233 B2 reveals a magnetic field sensor consisting of two sensors. The two sensors each comprise two ferromagnetic elements and one magnetoresistive element with a sensitivity in an X-Y plane. An external magnetic field to be measured and guided in the Z direction is not measurable with the magnetoresistive element. Because the magnetic field guided in the Z direction can be deflected in the X direction by the two ferromagnetic elements, the magnetic field to be measured may be detected in the same direction by means of the magnetoresistive element. In this respect, the ferromagnetic elements serve to deflect and flux guide a Z magnetic field to be measured into the X-Y plane. The magnetoresistive magnetic field sensor described therein does not have a layer structure with two ferromagnetic reference layers, and moreover no second adjacent and identically constructed TMR elements with different preferred directions on a substrate are disclosed.

US 2017/0328963 A1 teaches a method for permanent magnetisation of a ferromagnetic layer of a magnetic field sensor device. A pinning field is injected perpendicular to a chip substrate surface, wherein a shape of the boundary of a soft magnetic patterning element generates horizontally oriented magnetic field components which allow pinning in adjustable directions in a chip substrate plane. This makes it possible for magnetic field sensor elements to be pinned together and simultaneously on a chip substrate surface in different axial directions, which are highly sensitive in two or more randomly bent directions. This document relates to a sensor layer structure with just a single, pinned reference layer, or "SSV layer stack", and does not disclose the application of antiparallel reference layers or measures for pinning with reduced pinning field strength, nor is any associated structure suggested.

US 2015/0318465 A1 relates to a magnetoresistive device comprising a magnetoresistive structure for measuring a magnetic field with different widths of a TMR layer stack. The magnetoresistive structure is constructed in the manner of a layered double TMR layer with two TMR barriers in a layer stack. A free layer is arranged between the two TMR layer stack layers and reference layers are furthermore arranged above and below. U.S. Pat. No. 7,605,437 B2 likewise relates to a layered double TMR layer with two TMR barriers in one layer stack.

DE 11 2010 003 775 T5 describes a field sensor which can also detect a Z component in an X-Y plane. To this end, the sensor contains soft magnetic flux guides, the sole purpose of which is to divert the perpendicular magnetic field into the plane. In this case, all the magnetoresistive elements have identical pinning directions.

Like DE 11 2010 003 775 T5, US 2018/0238972 A1 relates to a field sensor for determining a Z component in an X-Y plane. It explains how the Z component can be detected by guidance of the field to be measured by means of soft magnetic structures.

It is an object of the present invention to indicate a layer structure for a magnetoresistive magnetic field sensor, a magnetoresistive magnetic field sensor and a method for producing the layer structure or the magnetic field sensor, which are improved over the prior art.

SUMMARY OF THE INVENTION

The object is achieved by an arrangement of at least two adjacent layer structures and a magnetoresistive magnetic field sensor, which uses this arrangement, and by a method for producing this arrangement of layer structures and by a method for producing a magnetoresistive magnetic field sensor.

In the arrangement of at least two adjacently arranged layer structures, each layer structure comprises at least one antiferromagnetic layer, a first ferromagnetic layer with a first magnetic moment, wherein exchange coupling is present between the antiferromagnetic layer and the first ferromagnetic layer, and a second ferromagnetic layer with a second magnetic moment, wherein the second ferromagnetic layer is antiparallel coupled with the first ferromagnetic layer via a non-magnetic coupling layer arranged between the first and second ferromagnetic layers.

It is proposed that the magnetisation, i.e. the pinning direction, of the corresponding first and corresponding second ferromagnetic layers of the adjacently arranged layer structures differs from one another, in particular is of substantially mutually opposed orientation. Opposed means an antiparallel orientation, i.e. the two pinning directions are rotated by 180° relative to one another. A substantially opposed orientation also allows mutual deviation within an angular range of 160° to 200°, such that the pinning directions are oriented antiparallel by substantially 180°, i.e. are opposedly oriented, and allow a further deviation of up to ±20° from an antiparallel orientation.

Adjacent means that the adjacent layer structures are arranged with their surfaces next to one another on a substrate and no further layer structures are arranged between the adjacent layer structures. If a plurality of adjacent layer structures is mentioned, this means that each of this plurality of layer structures has at least one further layer structure, between which no further layer structure lies. It is possible, however, for other structures to lie between two adjacent layer structures, for example a conductor track or flux guide element, or a soft magnetic patterning element. It is likewise conceivable for a "dummy" layer structure to be located between two adjacent layer structures, i.e. a layer structure the resistance of which is not part of the resistance of the sensor, which is present virtually only as a placeholder layer structure and the direction of magnetisation of which does not play any role in the resistance behaviour of the sensor.

The antiferromagnetic layer, the first and second ferromagnetic layers and the coupling layer form a reference layer stack which can be pinned by the use of the two ferromagnetic layers at very low magnetic field strengths. The resultant total magnetic moment $M_{\_APP\_SV}$ of the two ferromagnetic layers $M_{FM1}$ and $M_{FM2}$ of the layer structure is obtained from:

$$a.\ M_{\_APP\_SV} = M_{FM1} - M_{FM2} < M_{SSV},$$

and is substantially less than the resultant moment $M_{SSV}$ of a simple spin valve layer structure (SSV) with comparable magnetoresistive characteristics. This layer structure may be denoted an unbalanced antiparallel coupled pinned layer structure (APP—antiparallel coupled pinned layer spin valve).

In relation to the above-mentioned layer structure, in particular in relation to balanced APP structures with a total magnetic moment of virtually zero, the necessary pinning field strength is reduced order of magnitude-wise by a factor of 10. Thus, the layer structure according to the invention constitutes an optimisation in terms of the possibility of carrying out the pinning process, the thermal and magnetic stability and the size of the xMR effect. The resultant markedly reduced intensity of the pinning field for the first time enables pinning of closely adjacent layer structures in different directions.

Advantageously, each layer structure has a round or elliptical outer contour. Furthermore, the adjacent layer structures may advantageously be of identical construction in terms of layer sequence, layer film thicknesses and the layer materials used. The first ferromagnetic layers of the at least two adjacent layer structures may here be of identical construction in terms of material and layer thickness, and the second ferromagnetic layers of the at least two adjacent layer structures may here be of identical construction in terms of material and layer thickness. The non-magnetic coupling layers of the at least two adjacent layer structures may also be of identical construction in terms of material and layer thickness, as may the antiferromagnetic layers of the at least two adjacent layer structures.

In one advantageous embodiment, the centre-to-centre distance ΔD of the adjacent layer structure may amount to 50 micrometer (μm) or less, preferably 20 μm or less and in particular 10 μm or less for small layer structures. Thus, as a result of the close spacing, different pinning directions may be achieved for virtually identically constructed layer structures in the most confined space with similar material properties and production process conditions. This is because for example a soft magnetic patterning element may be introduced in the confined spacing region between the adjacent layer structures. If this is passed through by a pretreating magnetic field, which is preferably oriented perpendicular to the position of the layer stack planes, a stray magnetic field arises at the boundary of the patterning element, which stray field passes, perpendicularly relative to the boundary edge of the patterning element, through the adjacent layer structures as a pinning field. Thus, depending on the shape of the patterning element (rectangular, square, quadrangular, polygonal, rounded etc.), it is possible to achieve the most varied pinning directions in which adjacent layer structures are spaced merely by a distance of less than 50 µm, preferably less than 20 µm and in particular less than 10 µm. This distance may be considered a minimum distance, wherein in real structures a row of spaced layer structures are arranged functionally relative to one another and electrically interconnected, and wherein at least two adjacent layer structures, but not necessarily all the layer structures, achieve this minimum distance.

The antiferromagnetic layer of each layer structure may for example be produced from FeMn, IrMn, PtMn, NiMn, and have a thickness of between 5 nanometer (nm and 30 nm.

The coupling layer of each layer structure, which brings about an antiparallel orientation of the second ferromagnetic layer with regard to the first ferromagnetic layer, may for example consist of a metallic, non-magnetic material, for example of Ru or Rh, and have a thickness of between 0.3 nm and 1.5 nm.

Preferred embodiments of the first and second ferromagnetic layers of each layer structure will be described in greater detail below.

In one advantageous embodiment, the arrangement of layer structures may comprise at least three, in particular four or more layer structures, which are arranged adjacent one another separated from one another, in particular merely by an interspace, or a soft magnetic patterning element. In particular, the magnetisations of the layer structures are arranged angled in pairs relative to one another, preferably by 90°, but also by 60°, 45°, 36°, 30°, 18° or 15°, and the magnetisation of the corresponding first and corresponding second ferromagnetic layers of each pair of the adjacent layer structures of each pair differ from one another and preferably are substantially mutually opposed, i.e. antiparallel relative to one another. In particular, the pinning directions of the magnetisation of a pair of opposing layer structures are oriented opposed to one another by substantially 180°. It is thus possible to achieve not just two mutually differing pinning directions, in particular opposingly oriented by substantially 180°, of adjacent layer structures. Rather, two times two or more pairs of layer structures, for example six times two pairs, may be provided with mutually different pinning directions, wherein mutually corresponding pairs of layer structures provided in particular with pinning directions opposed by substantially 180° may respectively in turn be offset relative to one another by any desired angle, e.g. 90°, but also for example 15°, 18°, 30°, 36°, 45° or 60°. Thus, for example an arrangement of layer structures may be produced for harmonic filtering for error minimisation of rotation angle sensors, as described for example in WO 2016/083420 A1. The respective pairs of corresponding and opposing layer structures may also have a pinning direction deviating from 180°, but also for example deviating from 160° or 200°. This may be achieved by a wedge-shaped external structure of a soft magnetic patterning element and may be used for filtering high-frequency harmonic errors. Thus, a side face of the patterning element may for example have a stepped angular profile, preferably an angular profile forming one of angles 15°, 18°, 30°, 36°, 45°, 60°, 75° or 90°, wherein opposing side faces may preferably be formed mirrored at a centre axis. More than four, for example six, eight or multiple pairs of layer structures may also preferably be arranged mirror-symmetrically or rotationally symmetrically relative to one another. In the case of six pairs, these may be offset in each case by 30° relative to one another, or four pairs may be offset by 45° relative to one another, wherein the respective pairs have 180° opposing magnetisation, i.e. pinning direction.

Starting from the above embodiment, two pairs of layer structures are preferably arranged adjacent one another, wherein a first pair of layer structures is substantially oppositely magnetised and a second pair of layer structures is magnetised substantially oppositely in pairs. The directions of magnetisation of the second pair may moreover be non-identical to the direction of magnetisation of the first pair, and preferably be angled by 90°, 60°, 45°, 36°, 30°, 18° or 15°. The pinning directions of the layer structures are thus in each case antiparallel in pairs, and the pinning directions of adjacent pairs of layer structures point away from one another by an angle of 90° or less. The individual layers of the layer structures of the pairs of layer structures may in each case be identical to one another in terms of material and layer thickness.

In one advantageous embodiment, in each layer structure the quotient of the first magnetic moment of the first ferromagnetic layer coupled with the antiferromagnetic layer and the second magnetic moment of the second ferromagnetic layer, which is coupled antiparallel with the first ferromagnetic layer, may be different from 1 and may preferably amount to between 1.7 and 2.3. Thus, the first ferromagnetic layer coupled with the antiferromagnetic layer per exchange coupling has roughly twice as high a magnetic moment as the second ferromagnetic layer, which is located on the side of the first ferromagnetic layer remote from the antiferromagnetic layer, and which is antiparallel coupled with the first ferromagnetic layer via a non-magnetic coupling layer.

The stated quotient of the first and second magnetic moments relates for example to the condition of the deposited but not yet pinned first and second ferromagnetic layers or may also relate to the condition after pinning of the two layers.

According to one advantageous embodiment, each layer structure comprises a third ferromagnetic layer, which is arranged on the side of the second ferromagnetic layer remote from the coupling layer, wherein a non-magnetic, in particular non-conductive barrier layer, preferably of MgO, is arranged in particular between the second and third ferromagnetic layers. The third ferromagnetic layer conventionally takes the form of a detection layer. The third ferromagnetic layer is preferably made from Co, CoFe, NiFe or CoNi, wherein optionally one or more further elements may be added to the alloy, in particular boron or silicon. It may also consist of a multilayer system of different materials, which contain soft magnetic CoFe or NiFe. The barrier layer serves in particular to optimise the magnetoresistive tunnel effect.

Furthermore, according to the above embodiment, each layer structure may comprise at least one non-magnetic, in particular metallic cover layer, which is arranged on the side of the third ferromagnetic layer remote from the second ferromagnetic layer. The cover layer delimits the layer structure relative to adjacent structures located thereover and may in particular also serve in transmitting the measuring currents.

A terminating electrode layer, which may serve as a contact electrode for electrical contacting, may be positioned following a cover layer of each layer structure or optionally directly on the third ferromagnetic layer.

The terminating or cover layers are preferably identical on all the layer structures with regard to material and layer thicknesses.

Each layer structure is advantageously applied to a substrate, wherein a "seed layer" may be applied between the substrate and the antiferromagnetic layer, which "seed layer" may promote growth of the antiferromagnetic layer, and may serve as a base electrode. In principle, the layer structure between the seed and cover or terminating electrode layer may be applied to a substrate in the reverse sequence to that described here.

According to a further advantageous embodiment of the invention, in each layer structure, the first ferromagnetic layer consists of a first ferromagnetic material composition and the second ferromagnetic layer of a second ferromagnetic material composition, wherein the first ferromagnetic material composition is different from the second ferromagnetic material composition. The different material compositions, which may differ in terms of the chemical elements contained therein and/or the proportions thereof, promote the formation of the different magnetic moments of the ferromagnetic layers of the reference layer stack.

Advantageously, the first ferromagnetic material composition is a CoFe alloy, wherein in particular the mole fraction or atomic percentage of Fe amounts to between 5% and 15% and preferably 10%.

Advantageously the second ferromagnetic material composition in each layer structure is a CoFeB alloy, wherein, in the context of a respective tolerance deviation, the mole fraction, or the atomic percentage of Co and Fe, amounts in each case to 40% and the proportion of B amounts to 20%, wherein the tolerance deviation allows a respective proportion to deviate by no more than 5 percentage points and preferably by no more than 2.5 percentage points from the respective stated value for the proportion.

The above-stated material compositions have proven particularly suitable for forming the ferromagnetic layers with the desired ratio of magnetic moments thereof.

According to one advantageous embodiment, the first ferromagnetic layer in each layer structure has a first layer thickness $\Delta l1$ and the second ferromagnetic layer $\Delta l2$ has a second layer thickness, wherein the quotient $\Delta l1/\Delta l2$ of the first and second layer thicknesses amounts to between 1.2 and 2.5.

Advantageously, the first layer thickness $\Delta l1$ in each layer structure amounts to between 0.5 nm and 2.0 nm and preferably 1.2 nm, and the second layer thickness $\Delta l2$ is selected such that the quotient of the first and second magnetic moments amounts to between 1.7 and 2.3, wherein in particular the quotient of the magnetic moments is related to the condition of the deposited but not yet pinned first and second ferromagnetic layers.

For the two above-stated preferred material compositions, i.e. Co90Fe10 for the first ferromagnetic layer and Co40Fe40B20 for the second ferromagnetic layer, the quotient of the first and second layer thicknesses preferably amounts to between 1.36 and 1.84, in particular 1.6.

According to one advantageous embodiment, the coupling layer of each layer structure (in particular exclusively) comprises Ru and has a thickness of between 0.35 nm and 0.85 nm and preferably of 0.5 nm. Such dimensioning of the coupling layer has proven particularly suitable.

The antiferromagnetic layer of each layer structure may advantageously be configured as a manganese alloy. An iridium-manganese (IrMn), platinum-manganese (PtMn), nickel-manganese (NiMn) or iron-manganese (FeMn) alloy or an alloy mixture thereof is particular suitable therefor. The manganese alloy, in particular platinum-manganese (PtMn) or nickel-manganese (NiMn) is preferably present in an ordered $L1_0$ phase. An $L1_0$ phase is an intermetallic ordered phase of the metal alloy, which is distinguished by a regular mixed crystal structure, owing to which the antiferromagnetic characteristics of the manganese alloy appear in very pronounced manner. Such manganese-based antiferromagnetic layers retain or achieve their excellent antiferromagnetic characteristics even where pinning times last several hours and temperatures are above blocking temperature. For sputtered PtMn and NiMn layers, it is known that only with heating for several hours at temperatures of above 225° Celsius (° C.) is the preferred $L_10$ crystal order achieved, wherein such a crystal order achieves optimum antiferromagnetic characteristics, and this as a result of brief heating as cannot be achieved using a selective laser pinning method.

Each layer structure is advantageously configured as a TMR system. To this end, the layer structure may have a lower base electrode and an upper terminating electrode, such that current may flow through the layer structure in electrically contactable manner and perpendicular to the layer structure, i.e. perpendicular to the substrate surface. The seed layer, which is used as the base layer on the substrate for construction of the layer structure, in particular the antiferromagnetic layer, is preferably formed as an electrically conductive base electrode. Furthermore, in the first ferromagnetic layer, magnetisation may be impressed in one pinning direction and, in the second ferromagnetic layer, a magnetisation oriented antiparallel thereto may be achieved, such that very high sensitivity of the change in resistance to an external magnetic field may be achieved in the pinning direction. The layer structure according to the invention, including the advantageous embodiments thereof, has proven particularly suitable for application in TMR-based magnetic field sensors, in particular for use in angle sensors and 2D field sensors. Use in GMR-based magnetic field sensors is however alternatively likewise possible, wherein to this end the base and terminating electrodes may be arranged laterally on the layer structure.

At least two identically constructed, adjacent TMR elements may advantageously be arranged on a substrate and the directions of magnetisation of the corresponding first and corresponding second ferromagnetic layers may differ from one another, in particular be oriented oppositely or slightly differently from 180° but substantially antiparallel to one another. The adjacent TMR elements in this case comprise identical packages of layers and are produced in the same deposition process, in particular simultaneously. In this case, the centre-to-centre distance $\Delta D$ of the adjacent TMR elements may preferably amount to 50 μm or less, preferably 20 μm or less and in particular 10 μm or less. In this case, in an at least temporary arrangement of a soft magnetic patterning element between the two TMR elements, a pretreating magnetic field may be injected into the patterning element preferably perpendicular to the substrate surface. Stray fields of the patterning element, which contain field components oriented parallel to the substrate surface and perpendicular to the side face profile of the patterning element, act along the edges of the patterning element as an effective pinning field, to orient the magnetic orientation of the first ferromagnetic layer. To this end, a relatively small centre-to-centre distance $\Delta D$ of the layer structures or of the TMR elements on the substrate may be selected, and the patterning element either constructed therebetween on the substrate, or introduced temporarily, for example in the form of a punch. The pretreating magnetic field may act over the entire surface of the substrate, wherein, at the positions of the patterning elements corresponding to the edge orientations thereof, pinning may be achieved in different directions parallel to the substrate surface as a result of the locally acting pinning fields derived from the pretreating magnetic field. In contrast to conventional laser pinning methods, in which an in-plane pinning field, which is injected parallel to the surface of the substrate (wherein the pretreating magnetic field is thus identical to the pinning field), and the blocking temperature is exceeded by brief laser heating, according to this further development integrated pinning in different directions of virtually all the layer structures on a substrate is possible over a period of any desired length at low magnetic field strengths. This means in practice that all the TMR elements of all the sensors on a wafer substrate may be pinned in one step.

The above-mentioned arrangement of two or more adjacent, identically constructed and identically deposited TMR elements with pinning directions angled relative to one another, in particular antiparallel to one another, may conceivably also be embodied without the quotient of the first and second magnetic moments being limited to between 1.7 and 2.3. A critical factor is that the magnetic moments of the two ferromagnetic layers are such that pinning is possible with relatively low magnetic field strengths, such that an above-described multidirectional pinning method with patterning elements is also possible with TMR elements.

A magnetoresistive magnetic field sensor according to the invention comprises a substrate, an arrangement of at least two or more layer structures arranged adjacent one another on the substrate, according to one of the preceding embodiments, and at least one at least temporarily introducible soft magnetic patterning element arranged adjacent to or partially overlapping a respective layer structure, wherein the patterning element is configured and arranged to influence a pretreating magnetic field, which penetrates into the patterning element, so as to have the effect that magnetic field components differently oriented at least in the first ferromagnetic layer of adjacent layer structures, and extending parallel to a surface of the layer structure, become active as a stray magnetic field of the patterning field for use as a pinning field. The pretreating magnetic field is preferably injectable into the patterning element perpendicular to the surface of the substrate. As a rule, after the pinning operation the temporarily introduced patterning element is removed again. As a rule, the magnetic field sensor comprises one or more Wheatstone measuring bridges of magnetoresistive bridge resistors. Each bridge resistor comprises at least one, in particular a plurality of series-connected layer structures, which generally have a substantially identically oriented direction of magnetisation. In this respect, the layer structures, adjacent respectively at least in pairs, of the arrangement may in each case be interconnected in various bridge resistors of the Wheatstone measuring bridge.

The soft magnetic patterning element, which is made for example from a lithographically patterned nickel-iron alloy, is arranged in such a way that a pretreating magnetic field is injected into the patterning element(s) simultaneously and perpendicular to the surface of the respective layer structure and, at the location of the layer structure, also generates magnetic field components parallel to the surface of the respective layer structure, which penetrate at least in places through the first and second ferromagnetic layers. Adjacent layer structures may in this way be penetrated by differently oriented, preferably substantially opposing pinning fields. The pretreating magnetic field may for instance be a homogeneous magnetic field, which impinges perpendicularly on the surface of the layer structure, and which, due to the magnetic field characteristic and the geometric configuration of the patterning element, exits in the form of a non-homogeneous stray field also parallel to the layer structure surface at boundary edges and brings about pinning of the adjacent layer structures. In this way, any desired pinning directions may be provided in a respective layer structure, wherein an individual patterning element may also pin a plurality of layer structures simultaneously and also in different directions. The different pinning directions are substantially dependent on the outline shape of the patterning element which bounds the patterning element relative to the surface of the substrate.

The arrangement of soft magnetic patterning elements on a magnetoresistive magnetic field sensor and corresponding methods for producing the magnetic field sensor, which describe pinning of the layer structures of the magnetic field sensor, are described by way of example in WO 2016/078793 A1, the entire disclosure content of which is included by reference in this application. Different configurations of soft magnetic patterning elements are also known from this document.

It has surprisingly been found that soft magnetic patterning elements as described in WO 2016/078793 A1 are particularly suitable for pinning layer structures on a magnetic field sensor, something which is attributable to the fact that, to pin the layer structure according to the invention, a pretreating magnetic field with relatively low strength, less than 130 millitesla (mT) is all that is needed, and the pinning fields arising in the process, which as a rule have less than 80%, generally less than 50% of the strength of the pretreating magnetic field, are of markedly lower strength again. It is in particular possible to provide a plurality of layer structures according to the invention on one magnetic field sensor, which structures are magnetised in different spatial directions and in particular form a Wheatstone bridge, as described for example in WO 2016/083420 A1.

A method according to the invention for producing an arrangement of layer structures according to one of the above aspects comprises the steps of:

applying the layers to a substrate in the stated or reverse sequence between cover and seed layer, heating the layer structure to a temperature above a blocking temperature, at which the exchange coupling between the antiferromagnetic layer and the first ferromagnetic layer is cancelled out, injecting a pretreating magnetic field, in particular oriented perpendicular to the surface of the substrate (110), into the heated layer structure to establish a pinning field with different directions of magnetisation of the first ferromagnetic layer of adjacent layer structures at least for a period in which the temperature of the layer structure is higher than the blocking temperature, and cooling the layer structure to a temperature below the blocking temperature.

In a first step, an arrangement of at least two, in particular a plurality of magnetoresistive layer structures is applied adjacent one another, preferably GMR or TMR layer structures which have a layer structure corresponding to one or more of the above-stated aspects. In particular, the layers of all the layer structures are deposited simultaneously in one and the same coating process, whereby identical layer thicknesses and materials are achieved for adjacent layer structures. All the patterning processes may also preferably proceed in parallel and simultaneously for all the layer structures and not proceed sequentially, meaning that a first layer structure is not formed first followed by a second layer structure. It has proven extremely advantageous for all layer structures to be produced in an identical coating process, and for no sequential or dissimilar treatments of different layer structures to take place on the substrate. To orient the first ferromagnetic layer or layers, a temperature higher than the blocking temperature is applied, such that the exchange interaction between the first ferromagnetic layer and the antiferromagnetic layer is cancelled out. The ferromagnetic layer is then no longer pinned by the adjacent antiferromagnetic layer and behaves in a similar manner to a free layer. Then an external magnetic field, which is also denoted a pretreating magnetic field, is injected, wherein the field lines of the magnetic field are guided in such a way that at a suitable point they enter the layer structure as a pinning field parallel to the layer plane and there bring about adjustable magnetisation of the first ferromagnetic layer.

Advantageously, the arrangement of the layer structures is heated to at least 260° C., preferably to 280° C., which is sufficient, in particular with iridium-manganese, to achieve the blocking temperature, and thus enable pinning, i.e. orientation of the magnetisation of the first ferromagnetic layer. In the case of an antiferromagnetic layer comprising a PtMn or NiMn alloy, the typical temperatures are preferably over 300° C., in particular between 300° C. and 350° C.

The magnetic flux density of the injected pretreating magnetic field is no more than 200 mT and preferably no more than 100 mT, such that TMR elements or GMR elements based on antiparallel coupled spin valve layer structures (APP—antiparallel coupled pinned layer spin-valve) are easy and inexpensive to produce.

A time period for which the pinning field is injected into the arrangement of the layer structures heated to above blocking temperature amounts to at least 1 hour (h), preferably at least 5 h and particularly preferably at least 12 h. The very long injection time at high temperatures enables an ordered $L_1 0$ layer orientation of the antiferromagnetic layer and so significantly improves the antiferromagnetic characteristics.

A method according to the invention for producing a magnetoresistive magnetic field sensor according to the invention, which comprises at least one soft magnetic patterning element according to the above-described aspect, comprises the above-described method according to the invention for producing an arrangement of layer structures including the advantageous configurations of the method, and an at least temporary application of the at least one patterning element.

According to the invention, the pretreating magnetic field is injected via the patterning element as a pinning field into adjacent layer structures with different directions of magnetisation. Once pinning is terminated, the patterning element is preferably removed again, such that it may for example be applied temporarily to the substrate using conventional lithographic and electroplating methods and may be removed again using etching methods or material-removing methods. It is also conceivable to lower the patterning elements temporarily over the substrate in the form of a punch, and inject the pretreating magnetic field in this way. Alternatively, the soft magnetic patterning elements may also be retained at least in places as flux guide elements for the external magnetic field.

In one advantageous further development of the above production method, an arrangement of at least two adjacent, mutually spaced layer structures may be applied to the substrate, and the patterning element applied at least temporarily between the layer structures. During heating to above blocking temperature, a pretreating magnetic field may be injected perpendicular to the surface of the substrate into the patterning element or plurality of patterning elements, such that a non-homogeneous stray magnetic field generated by the patterning elements provides the desired orientations of the pinning field substantially parallel to the surface of the substrate. Orientation of the pinning-active magnetic field components parallel to the substrate surface from the pretreating magnetic field is dependent on the edge geometry of the patterning element, such that the orientation of the pinning field of the adjacent layer structures preferably differs from one another, in particular is substantially oppositely oriented. Through this further development of the production method, GMR and TMR elements can be pinned in a spatially closely adjacent arrangement in different preferred directions with a relatively weak pretreating magnetic field of less than 200 mT and preferably less than 100 mT, although the reference layers of the GMR or TMR elements contain two antiparallel coupled ferromagnets.

By combining the methods, in particular the possibility of pinning over a long period, of several minutes to hours, and the specific sequence of the layer structures with closely adjacent arrangements and materials (material selection), it is thus possible to use thermally particularly robust antiferromagnetic materials such as PtMn and NiMn in an optimised $L1_0$ phase additionally with thermally robust antiferromagnetic coupled first and second ferromagnetic layers in sensors and additionally to place in a confined space different TMR or GMR elements, which are identically manifested and produced apart from the pinning directions of the reference layer, which differ in part in direction, preferably being substantially oppositely oriented, i.e. in an angular range from 160° to 200° relative to one another.

Further advantageous configurations of the layer structure, of the magnetoresistive magnetic field sensor and of the production method are revealed by the description and figures.

BRIEF DESCRIPTION OF THE DRAWINGS

Further advantages are revealed by the present drawings and the associated descriptions of the drawings. The drawings show exemplary embodiments of the invention. The drawings and description contain numerous features in combination. A person skilled in the art will expediently also consider the features individually and combine them into meaningful further combinations.

In the figures.

DETAILED DESCRIPTION OF THE INVENTION

Identical elements are denoted with the same reference signs in the figures.

Figure 1:
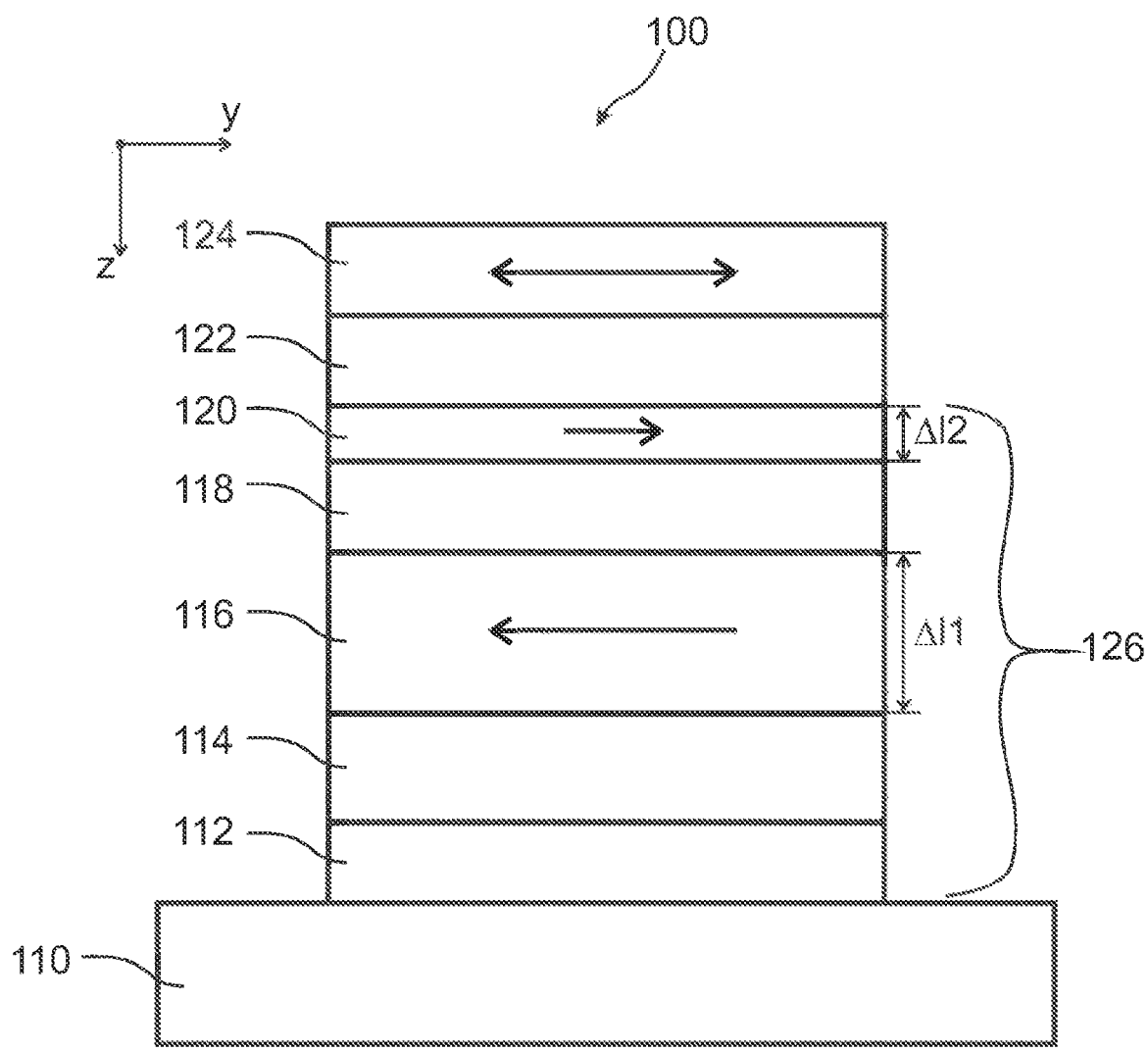
FIG. 1 is a schematic representation of a layer structure for an arrangement according to one exemplary embodiment of the invention.

FIG. 1 shows an embodiment of a layer structure 100 for an arrangement according to the invention, which is described in the present exemplary embodiment as a TMR system. For a configuration as a GMR system according to one modification of the exemplary embodiment, the changes that have to be made in relation to a TMR system are generally known to a person skilled in the art.

The various layers of the layer structure 100 are applied using coating methods, which are generally known and conventional in semiconductor technology, for example chemical or physical vapour deposition methods.

A plurality of layer structures 100 are applied to a semiconductor substrate or substrate 110. First of all, a seed layer 112 is applied to the substrate 110, which seed layer is selected such that a subsequently applied antiferromagnetic layer 114 grows which has optimum characteristics. The seed layer 112 is distinguished by sufficient electrical conductivity and the least possible surface roughness, such that, as base electrode 132, it forms a first electrical connection point.

The antiferromagnetic layer 114, which may also be denoted pinning layer, is applied to the seed layer 112. The antiferromagnetic layer 114 consists for example of FeMn, NiMn, IrMn or PtMn with a typical layer thickness of between 5 nm and 30 nm.

A first ferromagnetic layer 116 is then applied to the antiferromagnetic layer 114, which antiferromagnetic layer is applied from a CoFe alloy, typically Co90Fe10 (stated in percent by mass), with a thickness of 0.5 nm to 2.0 nm, typically of 1.2 nm.

An interlayer or coupling layer 118, which is made for example from Ru with a thickness of between 0.35 nm and 0.85 nm, typically 0.5 nm, adjoins the first ferromagnetic layer 116. By way of RKKY coupling, the coupling layer 118 brings about an antiparallel magnetic orientation of a second ferromagnetic layer 120 in relation to the first ferromagnetic layer 116.

The second ferromagnetic layer 120, which is made from a CoFeB alloy, typically Co40Fe40B20, is deposited onto the coupling layer 118. The layer thickness of the second ferromagnetic layer 120 is selected such that the magnetic moments of the deposited, not yet pinned ferromagnetic layers 116, 120 adopt a desired ratio. This ratio, more precisely the quotient of the magnetic moment M1 of the first ferromagnetic layer 116 and the magnetic moment M2 of the second ferromagnetic layer 120, M1/M2, may advantageously adopt a value between 1.7 and 2.3, typically 2.0. In relation to the above-stated material compositions of the ferromagnetic layers 116, 120, this corresponds to a ratio or quotient of the physical thickness D1 of the first ferromagnetic layer 116 and the physical thickness D2 of the second ferromagnetic layer 120, D1/D2 in a range between 1.36 and 1.94, typically 1.6.

The antiferromagnetic layer 114, the first ferromagnetic layer 116, the coupling layer 118 and the second ferromagnetic layer 120 together form a reference layer stack 126. To achieve the different magnetic moments, the two ferromagnetic layers 116, 120 may have different material compositions and/or different layer thicknesses. To this end, the first ferromagnetic layer 116 is shown with the thickness Δl1 and the ferromagnetic layer 120 with the thickness Δl2, wherein a reduced thickness indicates diminished magnetic moment.

A barrier layer 122 in the form of a non-conductive layer of MgO is additionally applied to the reference layer stack 126 or to the top of the second ferromagnetic layer 120, wherein the thickness thereof is selected such that the magnetoelectric tunnel effect, which is typically between 20% and 200%, and the tunnel resistance of the overall layer stack, which may typically be between 100Ω and 30 kΩ, are optimised for the relevant application. Finally, a third ferromagnetic layer 124 containing CoFe, Co or NiFe is applied onto the barrier layer 122, wherein one or more further elements, for example B, may additionally be added to the alloy. The third ferromagnetic layer 124 is configured such that the TMR effect is at a maximum.

Yet further ferromagnetic layers with identical or different material compositions or thicknesses may optionally be applied to the third ferromagnetic layer 124, such that the magnetic characteristics of the third electromagnetic layer 124, optionally including the further ferromagnetic layers, may be optimised as a detection layer.

Furthermore, one or more non-magnetic, metallic terminating layers or cover layers 128 may be provided on the layer structure 100, in order to delimit the layer structure 100 relative to environmental influences or adjacent elements located thereover.

Figure 2A:
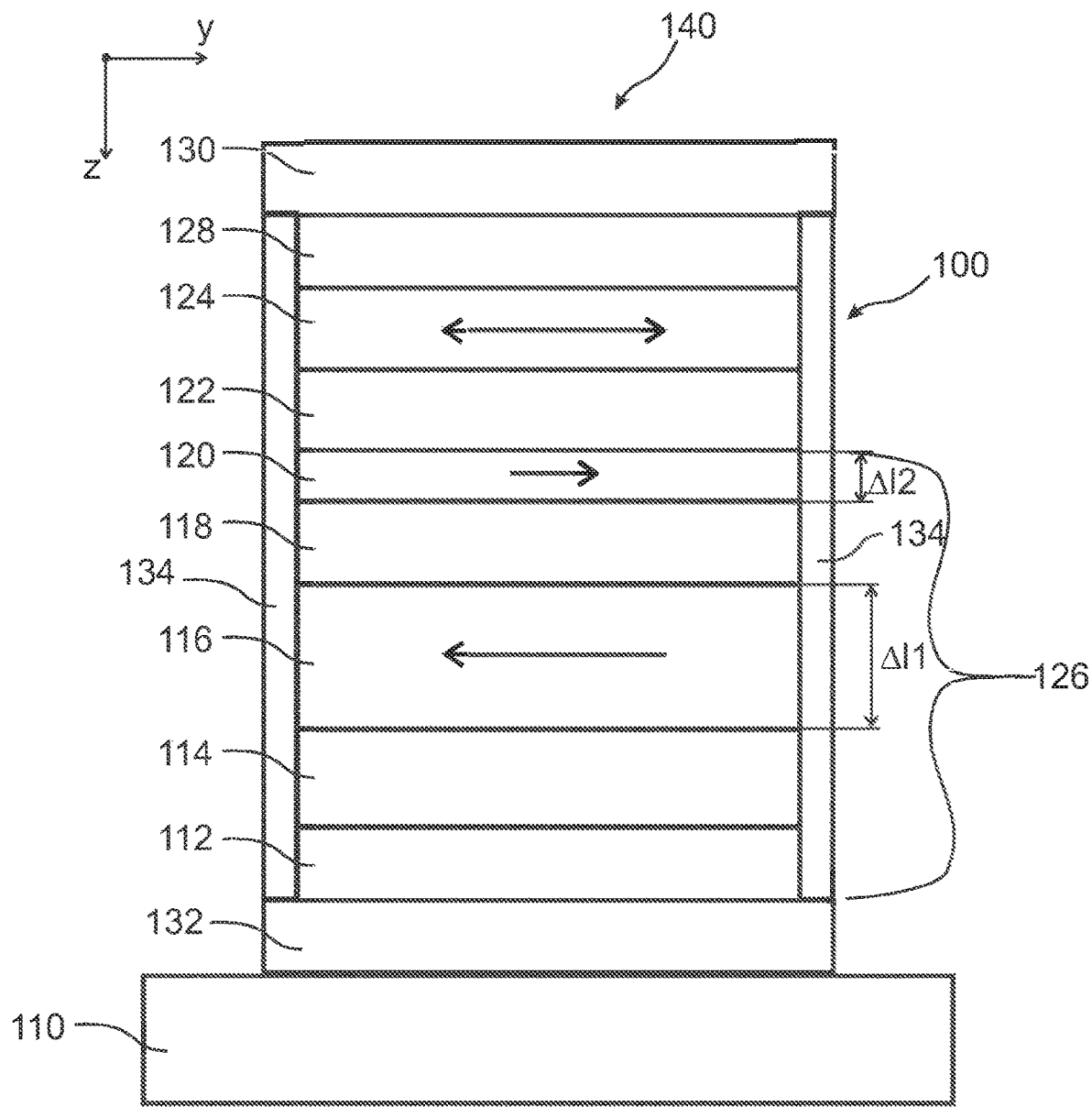
FIGS. 2a,b are schematic sectional representations of a layer structure for a TMR comprising an embodiment according to the invention of an arrangement of these layer structures.

FIG. 2a shows a layer structure which has been added to relative to the layer structure 100 of FIG. 1, as an embodiment of a TMR element 140 for an arrangement according to the invention. This comprises a base electrode layer 132 directly on the substrate 110 and a terminating covering electrode layer 130, together with a cover layer 128. The electrodes 130, 132 serve in electrical connection of the TMR element for example for a connection in a measuring bridge configuration of a magnetic field sensor 10. Due to the electrode configuration in the Z direction perpendicular to the substrate 110, the layer structure 100 may take the form of a TMR element 140, while a lateral electrode configuration may also provide a GMR element.

An insulation layer 134 covers the side faces of the TMR element 140, such that, on construction, a defined layer sequence and lateral delimitation relative to adjacent layer structures are enabled.

The stated layers 114-124 may also be applied to the substrate 110 in the reverse sequence between cover layer 128 and seed layer 112, i.e. starting with the third ferromagnetic layer 124 and terminating with the antiferromagnetic layer 114, or a further cover layer 128 and a base electrode 132.

The seed layer 112 may likewise be used as the bottom electrical connection point of a base electrode 132, or alternatively the base electrode 132 may be constructed separately from and vertically adjacent the seed layer 112 directly on the substrate 110. On the cover layer 128, a terminating electrode 130 may be applied as a top connection point of the layer structure. An electric current may thus be guided vertically through the layer structure, such that the layer structure is provided, as a magnetoresistive resistor, with a preferred direction of magnetisation defined in accordance with the magnetic orientation of the two ferromagnetic layers. The resultant magnetoresistive resistance layer arrangement may be used in magnetic field sensor arrangements or in magnetic storage arrangements with high sensitivity requirements.

Figure 2B:
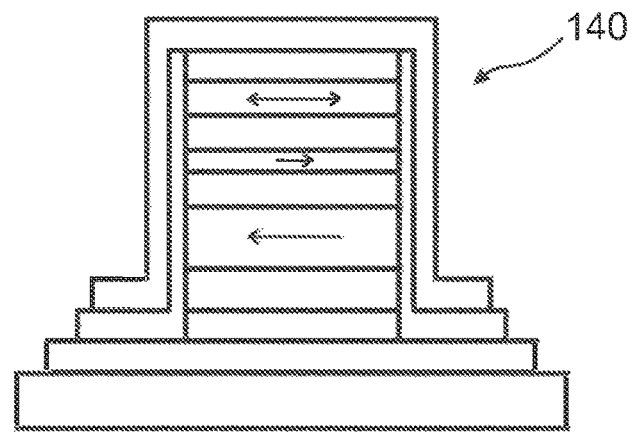

FIG. 2b shows, on a smaller scale, the TMR element 140 shown in FIG. 2a, wherein a more extensive insulation layer 134 encapsulates the TMR element 140 and insulates and passivates it relative to adjacent structures on the substrate 110.

Figure 3:
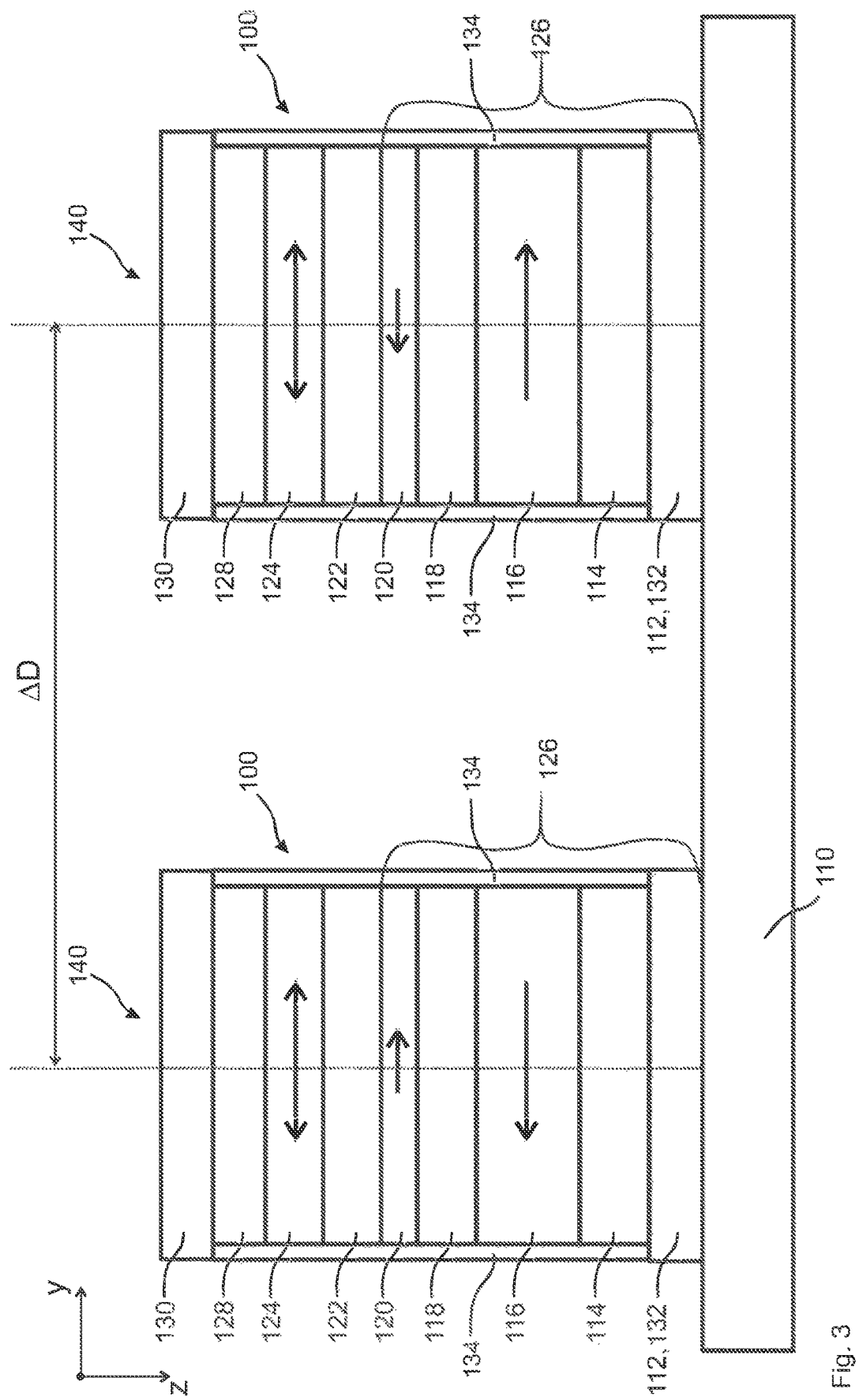
FIG. 3 is a schematic sectional representation of an embodiment of an arrangement of a pair of layer structures as TMR elements according to one exemplary embodiment of the invention.

FIG. 3 is a schematic representation of an embodiment of an arrangement of two adjacent TMR elements 140 with a centre axis spacing in the range from 5 µm to 50 µm, wherein each TMR element 140 substantially corresponds to the embodiment shown in FIG. 2a. However, the base electrode 132 is embodied as a conductive seed layer 112, such that the seed layer 112 serves simultaneously for electrical connection of the TMR element 140. For use in a magnetic field sensor, different pinning directions of magnetoresistive resistors of a measuring bridge are needed, which are ideally of identical construction to make the resistance behaviour uniform and are spatially very closely adjacent. This is achieved in FIG. 3 in that the centre-to-centre distance ΔD of the reference layer stack 126 amounts to between 5 µm and 50 µm, and the pinning directions of the adjacent reference layer stack 126 are opposing, i.e. oriented 180° antiparallel. Slight deviations by ±20° from a 180° deviation are also assumed to be substantially antiparallel. The electrical resistances of the two stacks thus behave oppositely to one another with an external magnetic field.

Figure 4:
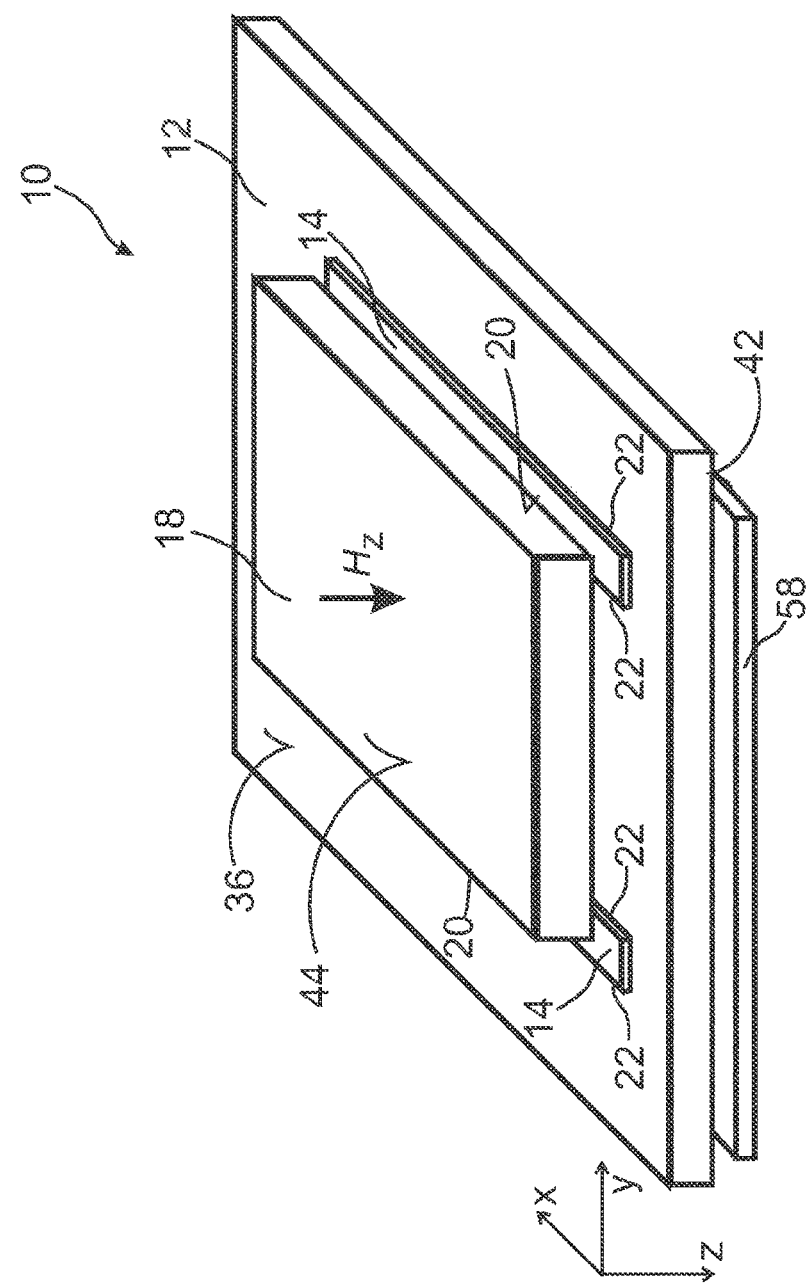
FIG. 4 is a perspective view of a magnetoresistive magnetic field sensor with an arrangement of a plurality of layer structures and a soft magnetic patterning element according to one exemplary embodiment.
Figure 5:
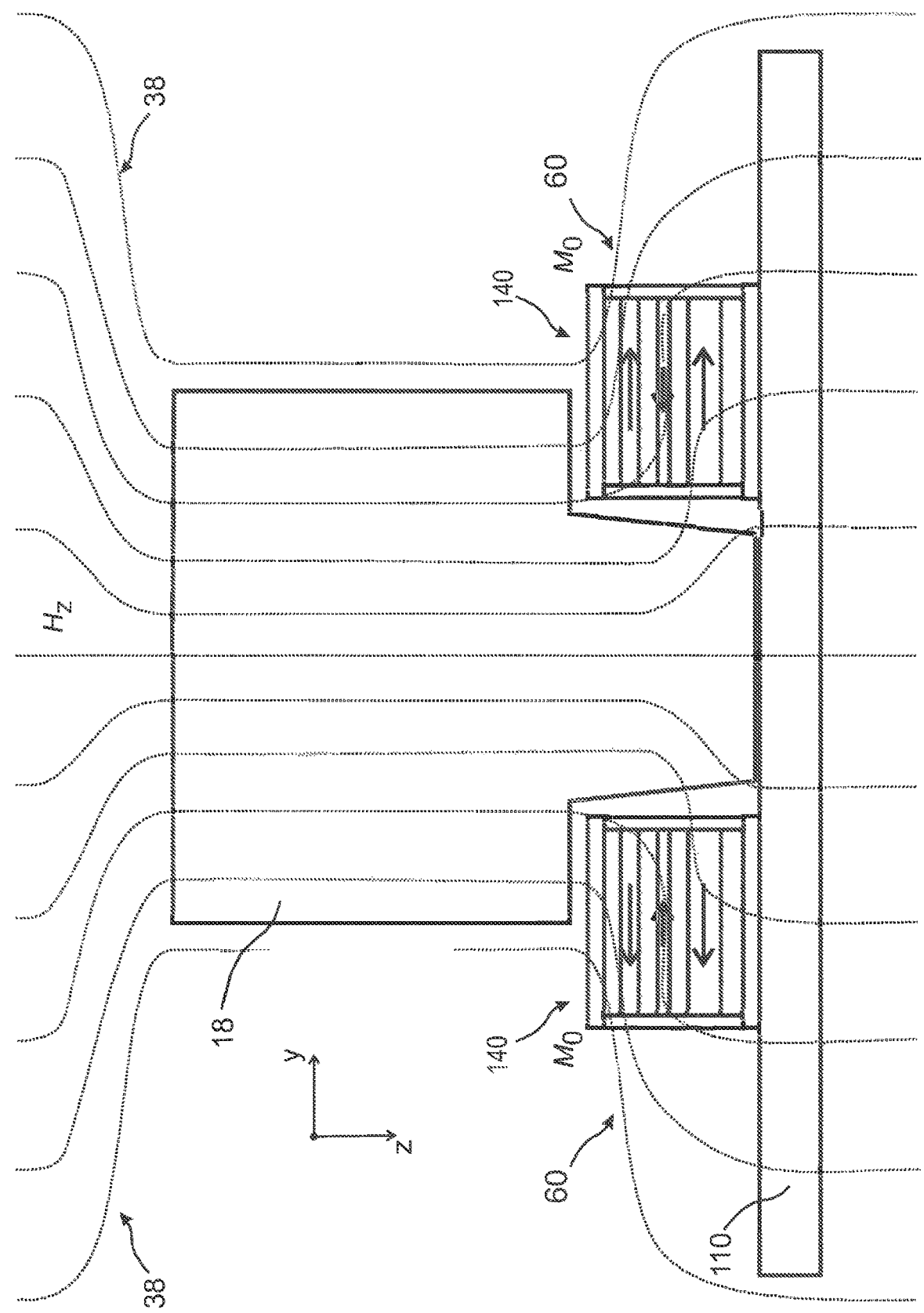
FIG. 5 is a schematic representation of a pinning step for the magnetic field sensor illustrated in FIG. 4.

So that the two pinning directions may be differently oriented, a soft magnetic patterning element 18 may advantageously be temporarily introduced between the two TMR elements 140 and magnetised in a Z direction by a pretreating magnetic field Hz, this being shown in perspective view in FIG. 4 and schematically in side view in FIG. 5.

According to an exemplary method for producing a layer structure according to the invention, the layer structure 100 may be subjected to a pinning process. To this end, the layer structure 100 is heated to a temperature above the blocking temperature of the layer structure 100, preferably to over 260° C., typically 280° C. The layer structure 100 is then exposed to a pretreating magnetic field Hz with a relatively low magnetic field strength of no more than 130 mT and preferably no more than 100 mT, wherein the field lines of the pinning field M0 derived therefrom and scattered by patterning elements extend parallel to the surfaces of the layer structure 100.

Pinning of the layer structures may proceed particularly advantageously with the assistance of one or more soft magnetic patterning elements 18. A corresponding magnetic field sensor arrangement is shown in perspective view in FIG. 4 and schematically in a side view with a diagrammatic representation of the field intensity profile of the pinning field in FIG. 5. A magnetoresistive magnetic field sensor 10, as shown in plan view in FIG. 6 with applied patterning elements 18, comprises a plurality of resistor elements 14, which are formed by a respective layer structure 100 according to FIG. 1. The magnetic field sensor 10 comprises a semiconductor chip substrate or substrate 12 on which resistor elements 14 are arranged. The resistor elements may be interconnected to form a Wheatstone measuring bridge. For magnetic pre-orientation, or "pinning" of the ferromagnetic layers of the resistor elements 14, a pretreating magnetic field Hz 38 is used, which is oriented perpendicular to the surface 36 of the substrate 12.

The magnetic field 38 is emitted by a magnetic pole, not shown, passes through the substrate 12 and is taken up again by an antipole surface 58, likewise not shown, which is arranged below the substrate 12. The pretreating magnetic field Hz 38 passes perpendicularly into a soft magnetic patterning element 18 and is guided in concentrated manner therein, wherein it exits as a pinning field M0 60 as a non-homogeneous stray field at right angles to a surface 44 of the patterning element 18 and substantially parallel to the surface of the substrate 110.

As illustrated diagrammatically in FIG. 5, the patterning element 18 guides the pretreating magnetic field Hz 38 in such a way that it exits at boundary edges 20 parallel to the substrate surface 36 as a pinning field M0 60 and passes through the resistor elements 14, which are embodied as TMR elements 140, parallel to the surface of the substrate 110. Improved penetration of the resistor elements 14 is achieved in particular in that a temperature above the blocking temperature of the antiferromagnetic layers of the resistor elements 14 is established, so as to improve flux guidance through the resistor elements 14.

The boundary edges 20 of the patterning element 18 overlap in one advantageous embodiment with the boundary edges 22 of the resistor elements 14. The resistor elements 14 are thus passed through over their entire width by magnetic fields which also have a component parallel to the substrate surface 36. Finally, the magnetic field lines are directed through the substrate 12 onto the antipole surface 58, such that different pinning directions may be established as a function of the orientation of the boundary edges 20 of the patterning elements 18 on the substrate 12.

Figure 6:
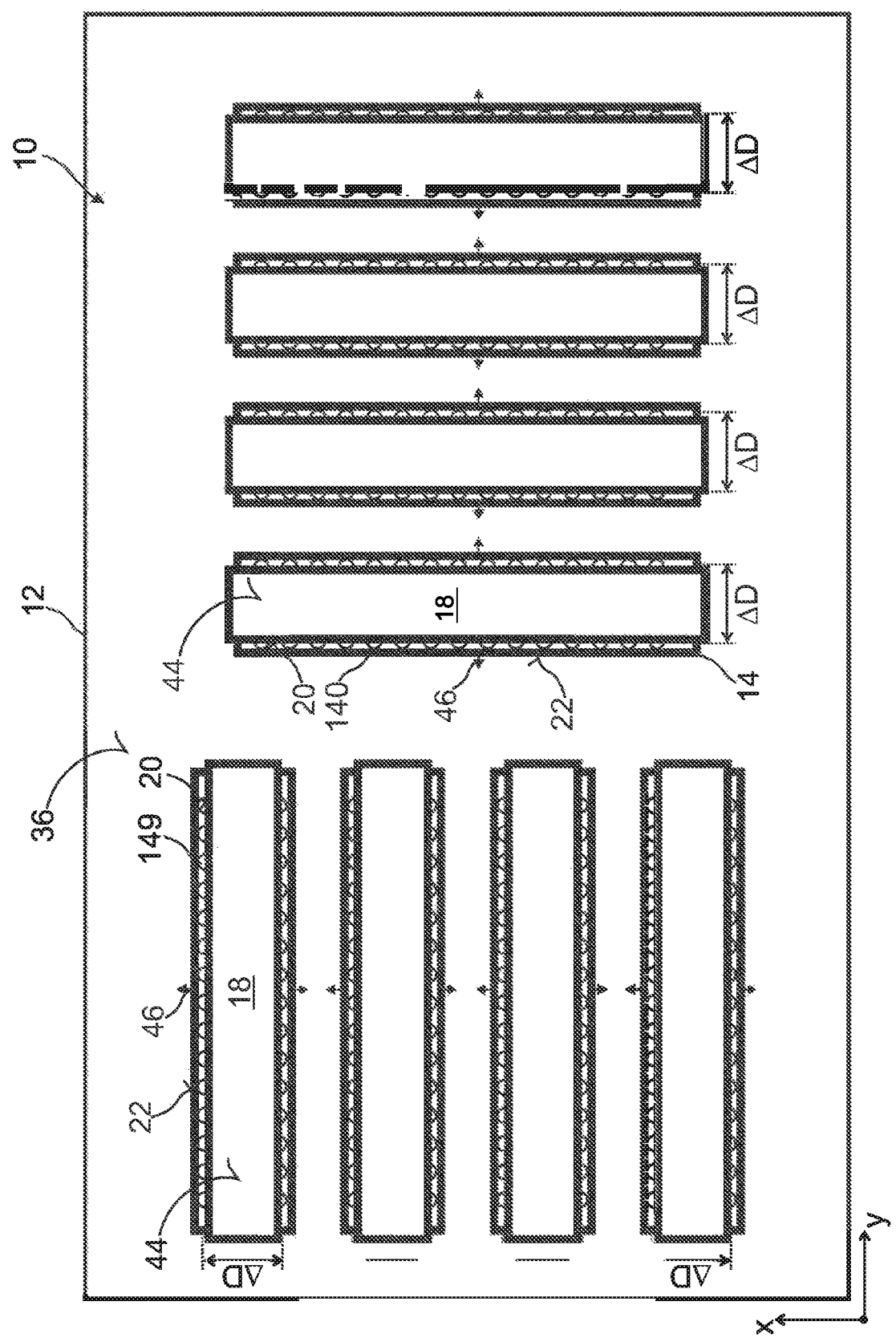
FIG. 6 is a plan view onto a magnetoresistive magnetic field sensor during a pinning process according to one exemplary embodiment.

FIG. 6 shows the production of a complex angle sensor consisting of two Wheatstone measuring bridges for measuring two rectilinear magnetic field components X and Y of a magnetic field sensor 10. For better illustration, the wiring level which connects the resistor elements in series circuits or in parallel circuits for example to form a Wheatstone measuring bridge is not shown. Likewise, the terminals or the pads for contact with the outside world are not shown. FIG. 6 shows the pinning step of a magnetic field sensor 10, wherein a plurality of resistor elements 14, for example TMR resistor elements 14 corresponding to an arrangement of layer structures 140 of FIG. 2, are arranged on a substrate surface 36 of a substrate 12. These are arranged at a centre-to-centre distance ΔD relative to one another at least for the TMR elements 140 angled in pairs, here pinned antiparallel. In these spacing regions AD, soft magnetic patterning elements 18, e.g. of NiFe are applied partly overlapping relative to the boundary edges 22 of the resistor elements 14, the boundary edges 20 of which at least partly cover the boundary edges 22 of the resistor elements 14. By applying a magnetic field directed perpendicular to the substrate surface 36, as indicated with the small arrows, boundary edge stray fields 46 of the patterning elements 18 are generated, which perform pinning of the resistor elements 14. After pinning, the patterning elements 18 may be removed from the substrate 110 again using a material-removing method.

FIG. 6 demonstrates that, due to this invention, complex sensors with a plurality of pinning directions may be produced, using thermally robust antiferromagnets such as PtMn or NiMn and thermally robust layer stacks with an antiferromagnetically coupled reference layer. All the sensors built on a wafer substrate may be pinned simultaneously in one step in any desired direction over a long period, which enables economically viable implementation even when using antiferromagnets which require long pinning for manifestation of the preferred $L1_0$ phase.

FIG. 7 shows different arrangements of layer structures 100 configured as TMR elements 140. To implement different pinning directions M0 during production, a soft magnetic patterning element 18 is introduced temporarily in the space between a plurality of pairwise layer structures 100. At a temperature above the blocking temperature, the patterning element 18 is exposed to a pretreating magnetic field Hz 38 oriented perpendicular to the stacking plane of the layer structures 100, wherein a stray magnetic field pointing at right angles away from the surrounding edges forms as the pinning field M0 60. The pinning field M0 60 is in the stacking plane of the patterning elements and magnetised, i.e. pins the corresponding ferromagnetic layers 116 and thus also the layer 120 of the layer structures 100 in respectively different directions.

Figure 7A:
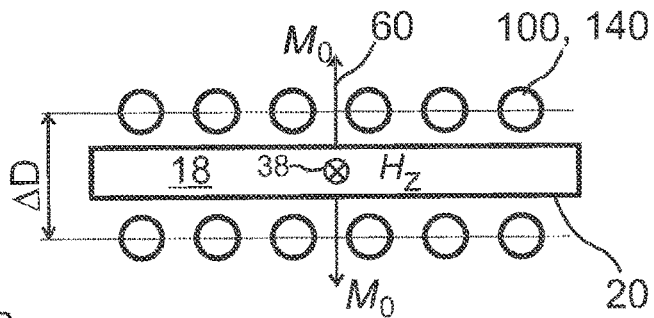
FIG. 7a-7d are schematic representations of embodiments of an arrangement of layer structures with different pinning directions.

FIG. 7a is a schematic representation of a row of 6 respectively paired TMR elements 140 spaced with a centre-to-centre distance □D which are oppositely pinned by means of a rectangular patterning element 18. In a series circuit of the TMR elements, two bridge resistors of a half-bridge of a magnetic field sensor 10 with opposing magnetic field sensitivity may thereby be formed.

Figure 7B:
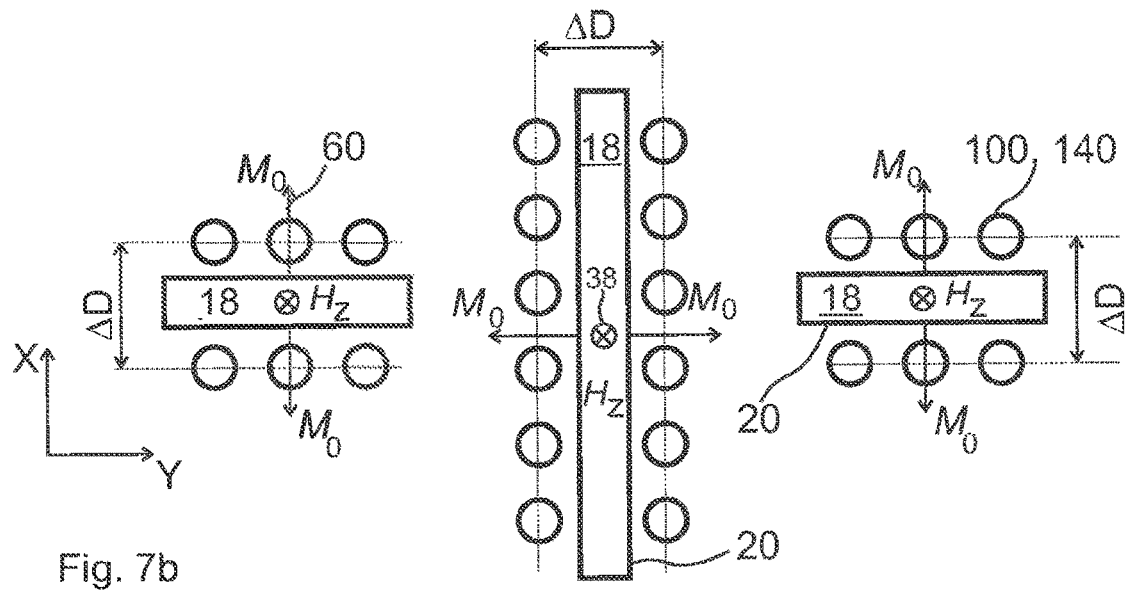

FIG. 7b is a schematic representation of a plurality of arrangements of TMR elements 140, which may be used for example for a magnetoresistive angle sensor and be interconnected for that purpose. A plurality of paired arrangements of TMR elements of FIG. 7a may be used offset by 90° to form X direction- and Y direction-sensitive bridge resistors. The patterning elements introduced temporarily between the TMR elements 140 are accordingly offset by 90° relative to one another, in order to provide pinning fields M0 60 in the X or Y direction.

Figure 7C:
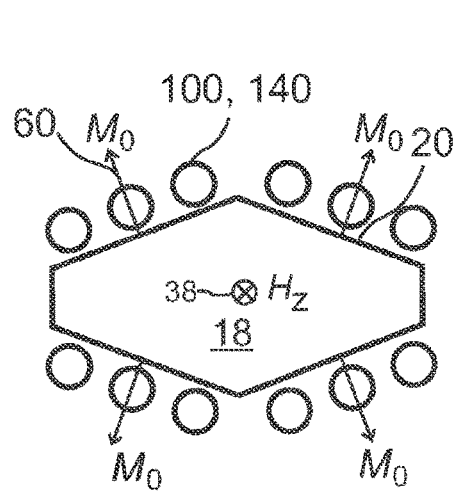
Figure 7D:
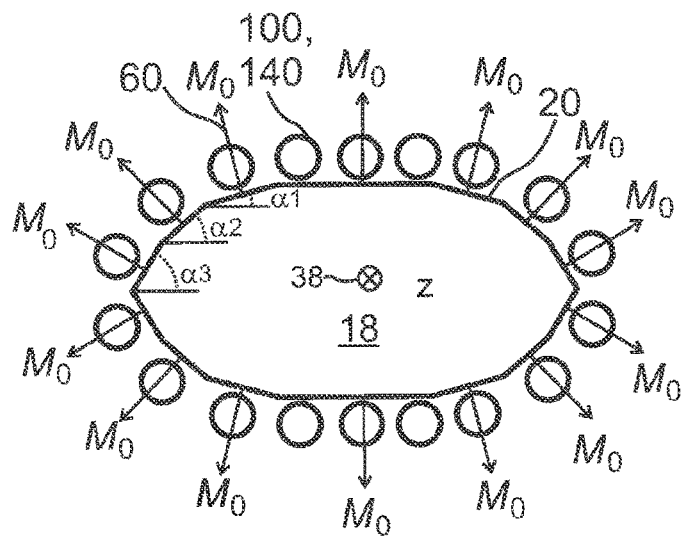

FIG. 7c and FIG. 7d show further embodiments of arrangements of layer structures 100 as TMR elements 140, between which a patterning element 18 with angled boundary edges 20 is arranged. In FIG. 7c, the patterning element 18 is hexagonal, wherein two pairs of pinning directions offset by 180° can be provided. The pairs may have a pinning direction differing by 90°, 60°, 45°, 36°, 30°, 18° or 15°.

The patterning element of FIG. 7d is configured as a tetradecagon, wherein the two mirror-symmetrically opposing boundary edges 20 have three symmetrical angular increments α1, α2 and α3 of −60°, −45°, 30°, 0°, 30°, 45° and 60°. In this respect, series-connected TMR elements may have different pinning directions for example for harmonic filtering, in particular when used as an angle sensor. The number of TMR elements 140 shown for each resistor arrangement is schematic, as a rule the number of TMR elements in each bridge resistor is markedly higher than shown.

In principle, pinning of an arrangement according to the invention of layer structure 100 (FIG. 1) may also proceed in any other suitable manner. The arrangement of soft magnetic patterning elements 18 may also be configured as punches which dip down briefly from above into the substrate structure.

LIST OF REFERENCE SIGNS

10 Magnetic field sensor
12 Substrate
14 Resistor element
18 Soft magnetic patterning element
20 Boundary edge of patterning element
22 Boundary edge of resistor element
36 Substrate surface
38 Pretreating magnetic field
42 Substrate bottom
44 Surface of patterning element
46 Boundary edge stray field
58 Antipole surface
60 Pinning field
100 Layer structure
110 Substrate
112 Seed layer
114 Antiferromagnetic layer
116 First ferromagnetic layer
118 Coupling layer
120 Second ferromagnetic layer
122 Barrier layer
124 Third ferromagnetic layer, detection layer
126 Reference layer stack
128 Cover layer
130 Terminating electrode
132 Base electrode
134 Insulation layer
140 TMR element
Hz Z-direction pretreating magnetic field
Δl1 Width of first ferromagnetic layer
Δl2 Width of second ferromagnetic layer
ΔD Centre-to-centre distance of adjacent layer structures
M0 Pinning field
α1 First side face angle
α2 Second side face angle
α3 Third side face angle

The invention claimed is:

1. An arrangement of at least two adjacently arranged and identically constructed layer structures for a magnetoresistive magnetic field sensor:
   each layer structure comprising;
      at least one antiferromagnetic layer;
      a first ferromagnetic layer with a first magnetic moment, wherein exchange coupling is present between the antiferromagnetic layer and the first ferromagnetic layer; and
      a second ferromagnetic layer with a second magnetic moment;
      a non-magnetic coupling layer arranged between the first and second ferromagnetic layers;
   wherein the second ferromagnetic layer is antiparallel coupled with the first ferromagnetic layer via the non-magnetic coupling layer;
   wherein corresponding first and corresponding second ferromagnetic layers of the layer structures are arranged adjacently with a centre-to-centre distance of 50 micrometer (μm) or less and magnetisation of the corresponding first and corresponding second ferromagnetic layers differs from one another in particular is of substantially mutually opposed orientation;
   wherein the different magnetisations of all corresponding ferromagnetic layers of the adjacent layer structures is simultaneously established in one pinning step.

2. The arrangement of layer structures according to claim 1, wherein the at least two adjacently arranged and identically constructed layer structures comprise at least three layer structures arranged adjacent one another, and the layer structures are separated from one another merely by an interspace, or a soft magnetic patterning element, and the magnetisation thereof differs from one another, wherein in particular the magnetisation of pairwise opposing layer structures is of mutually substantially opposing orientation, and wherein in particular the magnetisation of various pairs of layer structures is angled by preferably 90°, 60°, 45°, 36°, 30°, 18° or 15°.

3. The arrangement of layer structures according to claim 1, wherein the centre-to-centre distance of the adjacent layer structure amounts to 20 μm or less or 10 μm or less.

4. The arrangement of layer structures according to claim 1, wherein in each layer structure a quotient of the first and second magnetic moment of each layer structure is different from 1 and/or is between 1.7 and 2.3.

5. The arrangement of layer structures according to claim 1, wherein each layer structure comprises a third ferromagnetic layer, which is arranged on a side of the second ferromagnetic layer remote from the coupling layer, wherein a non-conductive barrier layer of magnesium oxide (MgO) is arranged in between the second and third ferromagnetic layers, wherein each layer structure comprises at least one non-magnetic cover layer, which is arranged on a side of the third ferromagnetic layer remote from the second ferromagnetic layer.

6. The arrangement of layer structures according to claim 1, wherein in each layer structure the first ferromagnetic layer consists of a first ferromagnetic material composition and the second ferromagnetic layer consists of a second ferromagnetic material composition, wherein the first ferromagnetic material composition is different from the second ferromagnetic material composition.

7. The arrangement of layer structures according to claim 6, wherein in each layer structure the first ferromagnetic material composition is a CoFe alloy, having a mole fraction of Fe between 5 and 15%.

8. The arrangement of layer structures according to claim 6, wherein the second ferromagnetic material composition in each layer structure is a CoFeB alloy, wherein, in the context of a respective tolerance deviation, the mole fraction of Co and Fe amounts in each case to 40% and the fraction of B amounts to 20%, wherein the tolerance deviation allows a respective fraction to deviate by no more than 5 percentage points or by no more than 2.5 percentage points from the respective stated value for the fraction.

9. The arrangement of layer structures according to claim 1, wherein the first ferromagnetic layer in each layer structure has a first layer thickness and the second ferromagnetic layer has a second layer thickness, wherein a quotient of the first and second layer thicknesses is between 1.2 and 2.5.

10. The arrangement of layer structures according to claim 9, wherein the first layer thickness in each layer structure is between 0.5 nanometer (nm) and 2.0 nm, and the second layer thickness is selected such that the quotient of the first and second magnetic moments is between 1.7 and 2.3.

11. The arrangement of layer structures according to claim 1, wherein in each layer structure the coupling layer consists, in particular exclusively, of ruthenium and has a thickness of between 0.35 nanometer (nm) and 0.85 nm.

12. The arrangement of layer structures according to claim 1, wherein in each layer structure the antiferromagnetic layer is a manganese alloy selected from iridium-manganese (IrMn), platinum-manganese (PtMn), nickel-manganese (NiMn), iron-manganese (FeMn) or an alloy mixture thereof, wherein the manganese alloy is present in a chemically ordered crystal structure L10 (L10 phase).

13. The arrangement of layer structures according to claim 1, wherein the arrangement of layer structures is arranged on a substrate, wherein each layer structure takes the form of a tunnel magnetoresistance element with a lower base electrode, preferably a base electrode configured as a seed layer, and an upper terminating electrode, wherein in the first ferromagnetic layer magnetisation is impressed in a pinning direction, and in the second ferromagnetic layer a magnetisation oriented antiparallel thereto is established.

14. A magnetoresistive magnetic field sensor, comprising:
a substrate;
an arrangement of at least two or more layer structures according to claim 1 arranged adjacently on the substrate; and
at least one at least temporarily introducible soft magnetic patterning element arranged adjacent to or partially overlapping a respective layer structure;
wherein the patterning element is configured and arranged to influence a pretreating magnetic field Hz, which penetrates into the patterning element, in such a way that magnetic field components differently oriented at least in the first ferromagnetic layer of adjacent layer structures become active as a stray magnetic field of the patterning element as a pinning field M0, extending parallel to a surface of the layer structure; and
wherein the pretreating magnetic field Hz is preferably injectable into the patterning element perpendicular to a surface of the substrate.

15. A method for producing an arrangement of layer structures according to claim 1, comprising the steps of:
applying the layers to a substrate in the stated or reverse sequence between a cover layer and a seed layer;
heating the layer structure to a temperature above a blocking temperature at which the exchange coupling between the antiferromagnetic layer and the first ferromagnetic layer is cancelled out;
injecting a pretreating magnetic field Hz oriented perpendicular to a surface of the substrate, into the heated layer structures simultaneously to establish a pinning field with different directions of magnetisation parallel to a plane of the layer at least of the first ferromagnetic layer of adjacent layer structures at least for a period during which the temperature of the layer structure is greater than the blocking temperature; and
cooling the layer structure to a temperature below a blocking temperature.

16. The method according to claim 15, wherein the arrangement of the layer structures is heated to at least 260° Celsius (° C.).

17. The method according to claim 15, wherein a magnetic flux density of the injected pretreating magnetic field Hz amounts to no more than 200 millitesla (mT).

18. The method according to claim 15, wherein a time period for which the pretreating magnetic field Hz is injected into the layer structure heated to above blocking temperature is at least 1 hour (h).

19. The method for producing a magnetoresistive magnetic field sensor comprising the steps of:
producing the arrangement of layer structures according to the method of claim 16; and
at least temporarily applying the at least one patterning element;
wherein the pretreating magnetic field Hz is injected into the layer structures with different directions of magnetisation via the patterning element as a pinning field, and whereafter the patterning element is removed again after termination of the pinning.

20. The method according to claim 19, wherein the arrangement of at least two adjacent, mutually spaced layer structures is applied to the substrate, and the patterning element applied at least temporarily between the layer structures, and wherein the pretreating magnetic field Hz is injected into the patterning element perpendicular to the surface of the substrate, such that a stray magnetic field generated by the patterning element provides as a pinning field substantially parallel to the surface of the substrate a different orientation of the pinning field of adjacent layer structures, the orientation of which is dependent on a side geometry of the patterning element, such that the orientation of the pinning field of the adjacent layer structures differs from one another, in particular is substantially opposingly oriented.

21. The arrangement of layer structures according to claim 1, wherein the magnetisation of the corresponding first and corresponding second ferromagnetic layers is of substantially mutually opposed orientation.

22. The arrangement of layer structures according to claim 1, wherein:
the at least two adjacently arranged and identically constructed layer structures comprise at least three layer structures arranged adjacent one another;
the at least three layer structures are separated from one another merely by an interspace, or a soft magnetic patterning element;
the magnetisation of the layer structures differs from one another; and
the magnetisation of pairwise opposing layer structures is of mutually substantially opposing orientation.

23. The arrangement of layer structures according to claim 22, wherein the magnetisation of various pairs of layer structures is angled by 90°, 60°, 45°, 36°, 30°, 18° or 15°.

24. The arrangement of layer structures according to claim 10, wherein the first layer thickness in each layer structure is 1.2 nm.

25. The arrangement of layer structures according to claim 1, wherein the coupling layer has a thickness of 0.5 nanometer (nm).

26. The arrangement of layer structures according to claim 13, wherein the lower base electrode is configured as a seed layer.

27. The magnetoresistive magnetic field sensor according to claim 14, wherein the at least one at least temporarily introducible soft magnetic patterning element overlaps between two or more adjacently arranged layer structures.

28. The method according to claim 20, wherein the pinning field of the adjacent layer structures is substantially opposingly oriented.

29. The arrangement of layer structures according to claim 2, wherein the at least two adjacently arranged and identically constructed layer structures comprise four or more layer structures arranged adjacent one another.

30. The arrangement of layer structures according to claim 5, wherein the non-conductive barrier layer of magnesium oxide (MgO) is non-conductive.

31. The arrangement of layer structures according to claim 7, wherein the mole fraction of Fe is 10%.

32. The arrangement of layer structures according to claim 10, wherein the first layer thickness in each layer structure is 1.2 nm.

33. The arrangement of layer structures according to claim 11, wherein the thickness of the coupling layer is 0.5 nm.

34. The arrangement of layer structures according to claim 12, wherein the manganese alloy is platinum-manganese (PtMn) or nickel-manganese (NiMn).

35. The magnetoresistive magnetic field sensor according to claim 14, wherein the at least one at least temporarily introducible soft magnetic patterning element arranged overlapping between two or more adjacently arranged layer structures.

36. The method according to claim 16, wherein the arrangement of the layer structures is heated to at least 280° C.

37. The method according to claim 36, wherein the arrangement of the layer structures is heated to at least 300° C.

38. The method according to claim 17, wherein the magnetic flux density of the injected pretreating magnetic field Hz amounts to no more than 100 mT.

39. The method according to claim 18, wherein a time period for which the pretreating magnetic field Hz is injected into the layer structure heated to above blocking temperature is at least 5 h.

40. The method according to claim 39, wherein a time period for which the pretreating magnetic field Hz is injected into the layer structure heated to above blocking temperature is at least 12 h.

* * * * *